US009916200B2

(12) United States Patent
Xu et al.

(10) Patent No.: US 9,916,200 B2
(45) Date of Patent: Mar. 13, 2018

(54) FAULT-TOLERANT DISTRIBUTED INFORMATION HANDLING SYSTEMS AND METHODS

(71) Applicant: Dell Products, LP, Round Rock, TX (US)

(72) Inventors: Ke Xu, Austin, TX (US); Dharmesh M. Patel, Round Rock, TX (US); William Brad Langford, Austin, TX (US)

(73) Assignee: Dell Products, LP, Round Rock, TX (US)

( * ) Notice: Subject to any disclaimer, the term of this patent is extended or adjusted under 35 U.S.C. 154(b) by 0 days.

(21) Appl. No.: 15/235,688

(22) Filed: Aug. 12, 2016

(65) Prior Publication Data

US 2018/0046545 A1 Feb. 15, 2018

(51) Int. Cl.
*H03M 13/00* (2006.01)
*G06F 11/10* (2006.01)
*G06F 3/06* (2006.01)
*H03M 13/15* (2006.01)

(52) U.S. Cl.
CPC .......... *G06F 11/1076* (2013.01); *G06F 3/064* (2013.01); *G06F 3/067* (2013.01); *G06F 3/0619* (2013.01); *H03M 13/154* (2013.01)

(58) Field of Classification Search
CPC .... G06F 11/1076; G06F 3/0619; G06F 3/064; G06F 3/067
See application file for complete search history.

(56) References Cited

U.S. PATENT DOCUMENTS 8,275,829 B2    9/2012  Plamondon
9,270,754 B2    2/2016  Iyengar et al.
2009/0083483 A1* 3/2009  Balakrishnan ...... G06F 11/1076
                                                        711/114

(Continued)

OTHER PUBLICATIONS

Plank, James S., "Erasure Codes for Storage Systems", ;login: The USENIX Magazine, vol. 38 No. 6, https://www.usenix.org/publications/login/december-2013-volume-38-number-6/erasure-codes-storage-systems-brief-primer, Date: Dec. 2013 pp. 44-50.

(Continued)

*Primary Examiner* — Sam Rizk
(74) *Attorney, Agent, or Firm* — Singh Law, PLLC; Ranjeev K. Singh

(57) ABSTRACT

Fault-tolerant distributed information handling systems and methods, including a method in a system including: a first host configured to store a first fragment of data, a second host configured to store a second fragment of data, a third host configured to store a third fragment of data, and a fourth host configured to store a first code derived at least from the first fragment of data, the second fragment of data, and the third fragment of data, are provided. The method includes: the first agent transmitting via a multicast operation an updated second fragment of data to the second host and the fourth host; a second agent corresponding to the second host transmitting via a unicast operation the second fragment of data to the fourth host; and generating a second code derived from the first code, the second fragment of data, and the updated second fragment of data.

13 Claims, 6 Drawing Sheets

(56) References Cited

U.S. PATENT DOCUMENTS

2016/0057226 A1    2/2016  Bestler et al.

OTHER PUBLICATIONS

"Implementing Layer-2 Multicast with IGMP Snooping", Cisco ASR 9000 Series Aggregation Services Router Multicast Configuration Guide, Release 4.2.x, http://www.cisco.com/c/en/us/td/docs/routers/asr9000/software/asr9k_r4-2/multicast/configuration/guide/b_mcast_cg42asr9k/b_mcast_cg42asr9k_chapter_00.html, pp. 1-52.
"Virtual SAN Troubleshooting: Multicast", VMware Blog, http://blogs.vmware.com/vsphere/2014/09/virtual-san-networking-guidelines-multicast.html, pp. 1-12.
"What's New with VMware Virtual SAN 6.2", VMware Blog, http://www.vmware.com/files/pdf/products/vsan/VMware_Virtual_SAN_Whats_New.pdf, pp. 1-17.
"VMware Virtual SAN 6.2 Network Design Guide", VMware Blog, http://www.vmware.com/files/pdf/products/vsan/VMware-Virtual-SAN-Network-Design-Guide.pdf, pp. 1-16.
"VMware Virtual SAN 6.2 Space Efficiency Technologies", VMware Blog, http://www.vmware.com/files/pdf/products/vsan/vmware-vsan-62-space-efficiency-technologies.pdf, pp. 1-15.
"RAID Levels and Components Explained", Raid Components and Concepts, http://tjscott.net/storage/raid.explained.pdf, pp. 1-23.
"RAID Level 5: Independent Data Disks with Distributed Parity Blocks", http://www.acnc.com/raidedu/5, p. 1-1.
"RAID Level 6: Independent Data Disks with Two Independent Parity Schemes", http://www.acnc.com/raidedu/6, p. 1-1.

* cited by examiner

FAULT-TOLERANT DISTRIBUTED INFORMATION HANDLING SYSTEMS AND METHODS

TECHNICAL FIELD

The present disclosure relates to information handling systems and methods and in particular to fault-tolerant distributed information handling systems and methods.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems often include distributed hosts configured to provide computing or storage resources to virtual machines. In certain information handling systems, a code, such as a parity code, may be generated to provide data protection. When the data in such systems is updated, the parity code is re-calculated. In distributed information handling systems, the parity code may be stored on a different host from the hosts storing the data. The re-calculation of the parity code requires several transmissions across the network connecting the various hosts. Such transmissions reduce the throughput of the network connecting the various hosts and impair the performance of the distributed information handling system.

SUMMARY

In one example, the present disclosure relates to a method in an information handling system (IHS) comprising: (1) a first host configured to store a first fragment of data, (2) a second host configured to store a second fragment of data, (3) a third host configured to store a third fragment of data, and (4) a fourth host configured to store a first code derived at least from the first fragment of data, the second fragment of data, and the third fragment of data. The method may include, in response to receiving a request by a first agent, corresponding to any of the first host, the third host, or the fourth host, regarding the second fragment of data: (1) the first agent transmitting via a multicast operation an updated second fragment of data to the second host and the fourth host; (2) a second agent corresponding to the second host transmitting via a unicast operation the second fragment of data to the fourth host; and (3) generating a second code derived at least from the first code, the second fragment of data, and the updated second fragment of data.

In another aspect, the present disclosure relates to a method in an information handling system (IHS) comprising: (1) N hosts, where N is a positive integer, and where each of the N hosts is configured to store at least one fragment of data (2) an N+1 host configured to store at least a first code derived from at least one fragment of data stored by each of a subset of the N hosts, (3) an N+2 host configured to store at least a second code derived from at least one fragment of data stored by each of the subset of the N hosts. The method may include performing several steps in response to receiving a request by a first agent corresponding to any of the N hosts regarding a first fragment of data stored by a second host from among the at least the subset of the N hosts. The method may include the first agent transmitting via a multicast operation an updated first fragment of data to the second host, the N+1 host, and the N+2 host. The method may further include a second agent corresponding to the second host transmitting via a multicast operation the first fragment of data to the N+1 host and the N+2 host. The method may further include an N+1 agent corresponding to the N+1 host generating a third code derived from at least the first code, the first fragment of data, and the updated first fragment of data. The method may further include an N+2 agent corresponding to the N+2 host generating a fourth code derived from at least the second code, the first fragment of data, and the updated first fragment of data.

In yet another aspect, the present disclosure relates to an information handling system (IHS) comprising N hosts, where N is a positive integer, and where each of the N hosts is configured to store at least one fragment of data. The IHS may further include an N+1 host configured to store at least a first code derived from at least one fragment of data stored by each of a subset of the N hosts. The IHS may further include a first agent corresponding to any of the N hosts configured to, in response to a request regarding a first fragment of data stored by a second host from among the at least a subset of the N hosts, transmit via a multicast operation an updated first fragment of data to the N+1 host. The IHS may further include a second agent corresponding to the second host configured to transmit via a unicast operation the updated first fragment of data to the N+1 host. The IHS may further include an N+1 agent corresponding to the N+1 host configured to generate a second code derived from the at least the first code, the updated first fragment of data, and at least one fragment of data stored by each of the subset of the N hosts.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
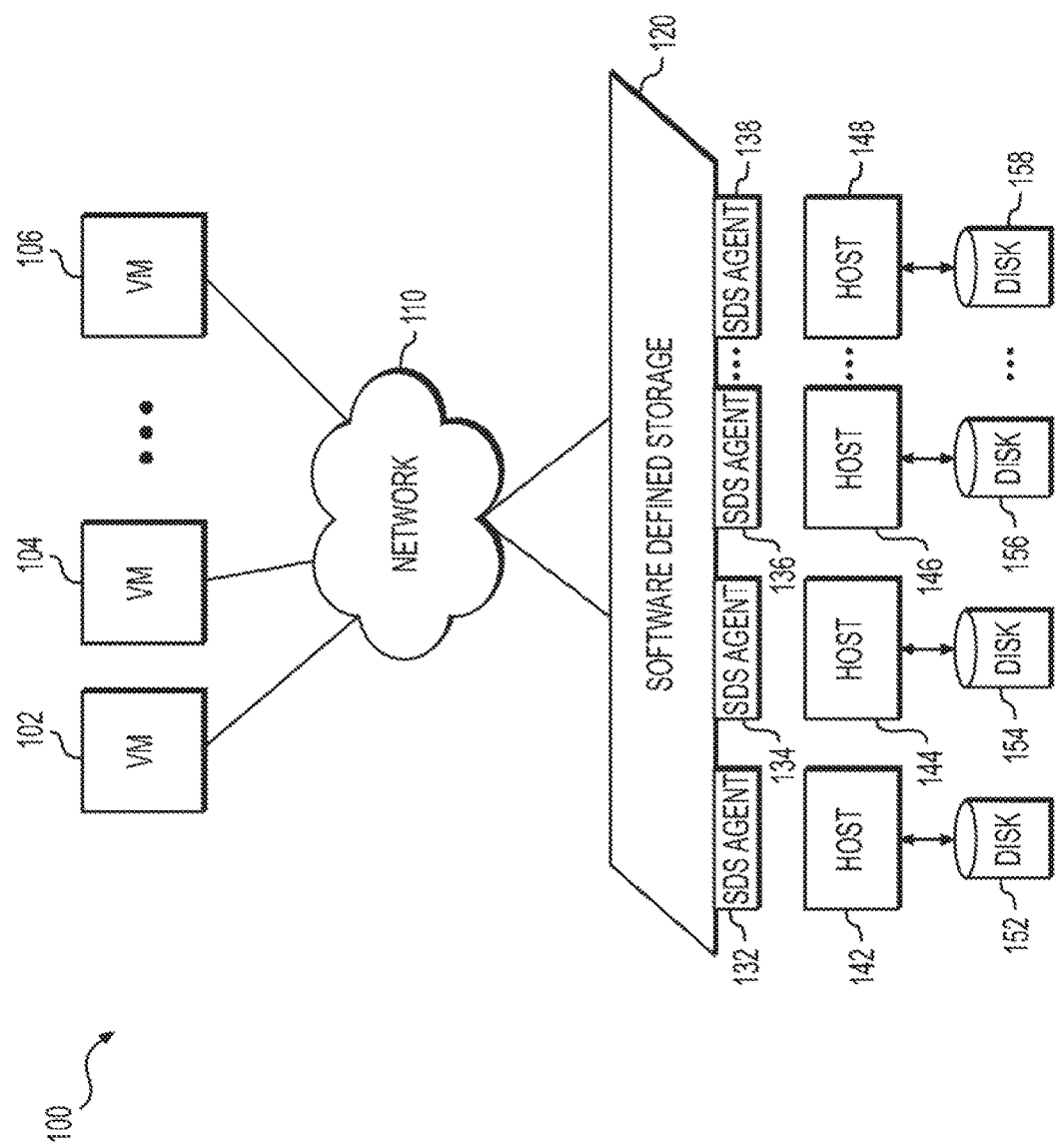
FIG. 1 is a block diagram of an information handling system in accordance with one example.

Examples described in this disclosure relate to fault-tolerant information handling systems and methods for such information handling systems. Certain examples relate to fault-tolerant distributed information handling systems and methods for such information handling systems. For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

In distributed information handling systems, data may be broken into fragments that may be stored across different storage disks or locations in a network. Storage disks, however, are prone to failures. These failures may include corruption of data, component failures, or complete failure of the storage disk. To provide fault-tolerance in such distributed information handling systems, data protection may be used. Data protection may include expanding the data fragments and encoding them with redundant data. Erasure coding is one method for data protection in which data is broken into fragments and stored across a set of different locations or storage disks. By spreading the data fragments across different nodes, in distributed storage systems such as object storage and other forms of software defined storage systems, erasure coding can provide data protection similar to the data protection provided by RAID 5 and RAID 6 implementations. Traditional erasure coding systems suffer from reduced write performance. This is because each update operation results in not only a recalculation of the code, such as a parity code, but also a read-modify-write sequence spawning multiple read and write operations across the network(s) connecting the distributed information handling system. As an example, in a software defined storage system with four hosts that provides RAID 5 level of protection, a single update to a data fragment results in two read and two write operations. For a distributed information handling system, these read and write operations result in a large network overhead. In large software defined storage systems that may involve continuously running write-intensive online transaction processing (OLTP) applications, a read-modify-write sequence is launched for each write/update request resulting in lower throughput and higher latency for such systems.

Certain examples of the present disclosure relate to fault-tolerant distributed information handling systems that distribute modify/write processing, with data protection that is equivalent to RAID 5 or RAID 6 data protection, from the write requestor side to the disks storing the data fragments for modification and the disk(s) storing the parity code. By significantly reducing the number of read/write operations conducted via the network, the present disclosure may advantageously improve performance. In one example, the relevant software defined storage entities spanning across multiple hosts and fault domains collect the necessary information and then conduct modification processing locally before writing any data to the storage disks. In general, by local read/write processing, the in-flight network traffic may be reduced so that the network bandwidth can be saved. In certain examples, for a single write request issued by a virtual machine, the present disclosure may advantageously save almost 50% of the network bandwidth for RAID 5 equivalent data protection and may advantageously save almost 66% of the network bandwidth for RAID 6 equivalent data protection.

FIG. 1 is a block diagram of an information handling system 100 in accordance with one example. Information handling system (IHS) 100 may include virtual machines 102, 104, and 106 connected via network 110 to a software defined storage system (SDS) 120. Virtual machines 102, 104, and 106 may contain an instance of an operating system and often at least one application. Such virtual machines may be independent compute resources that may run on a single computer. A hypervisor (not shown) may decouple the virtual machines from the hardware resources and may dynamically allocate computing resources, storage resources, network resources, or other types of resources to each virtual machine, as needed. Network 110 may be a wired network, a wireless network, or a combination of these. Network 110 may also be a private network, such as a private cloud-computing network. SDS 120 may be a virtualized storage with a service management interface. In general, SDS 120 may provide access to storage disks that may be managed via the service management interface. As an example, SDS 120 may include SDS Agents 132, 134, 136, and 138 that may provide access to storage disks or other types of storage resources. Any of virtual machines 102, 104, and 106 may communicate with hosts, such as hosts 142, 144, 146, and 148. Each of hosts 142, 144, 146, and 148 may, in-turn, be coupled to a corresponding storage disk, such as disks 152, 154, 156, and 158. Although FIG. 1 shows a certain number of components of IHS 100 arranged in a certain manner, there could be more or fewer number of components arranged differently.

Figure 2:
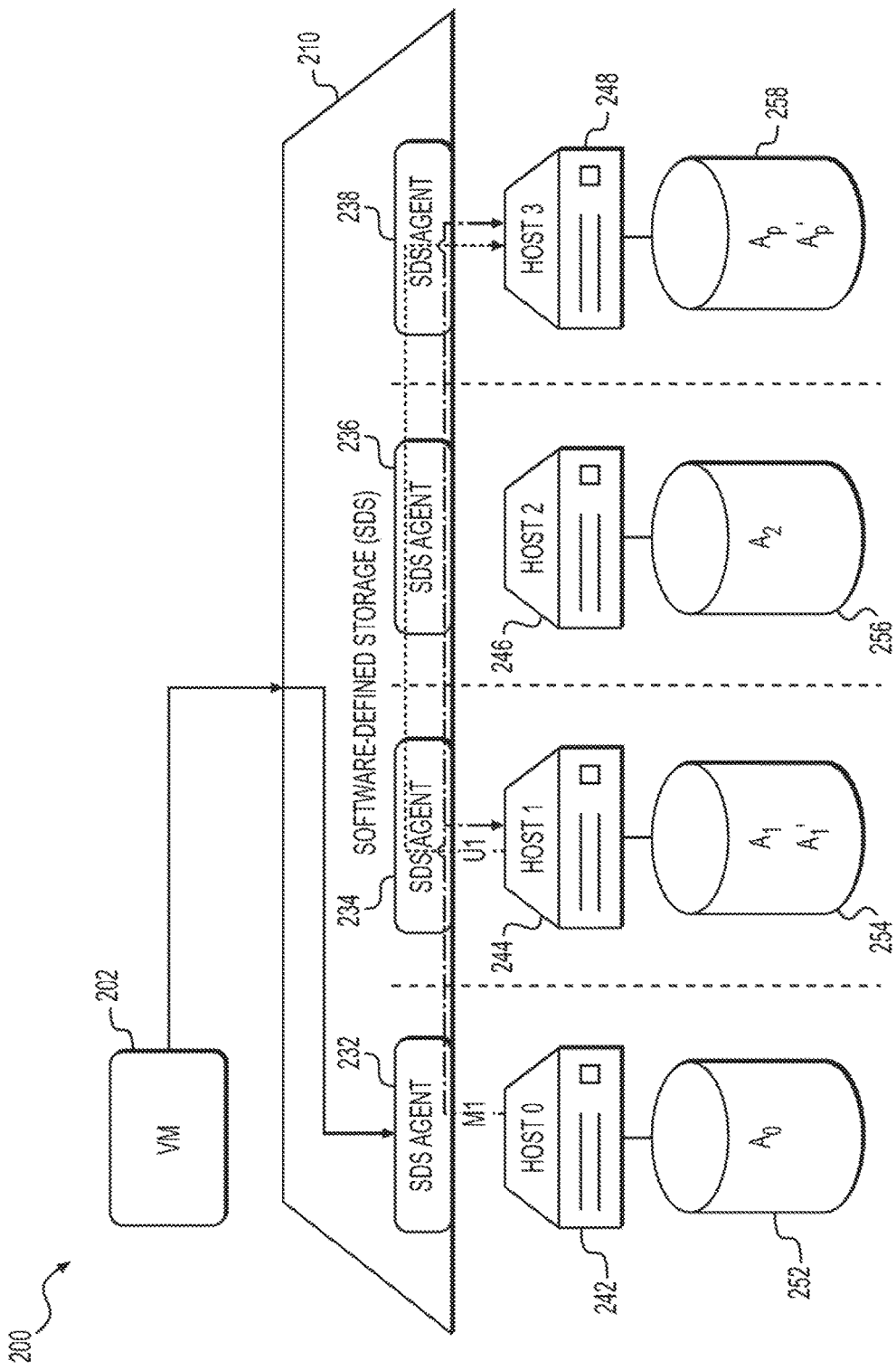
FIG. 2 is a block diagram of a fault-tolerant distributed information handling system with distributed hosts in accordance with one example.

FIG. 2 is a block diagram of a fault-tolerant distributed information handling system (FTDIHS) 200 with distributed hosts in accordance with one example. Virtual machine 202 may access FTDIHS 200 via software defined storage (SDS) cluster 210. In one example, virtual machine 202 may perform read/write operations on any of the storage resources associated with SDS cluster 210 via SDS Agents 232, 234, 236, and 238. Requests for read/write operations concerning any of the storage resources may also be issued by a software container, an application, or any other process besides a virtual machine. FTDIHS 200 may further include Host 0 242, Host 1 244, Host 2 246, and Host 3 248. Host 0 242 may be coupled to a storage disk 252. Host 1 244 may be coupled to a storage disk 254. Host 2 246 may be coupled to a storage disk 256. Host 3 248 may be coupled to a storage disk 258. SDS Agents 232, 234, 236, and 238 may be configured to run on a corresponding host. As an example, SDS Agent 232 may be configured to run on Host 0 242; SDS Agent 234 may be configured to run on Host 1 244; SDS Agent 236 may be configured to run on Host 2 246; and SDS Agent 238 may be configured to run on Host 3 248. The SDS Agents may be configured to communicate across multiple hosts (e.g., Host 0, 1, 2, and 3) via SDS cluster 210.

Still referring to FIG. 2, each SDS Agent may provide at least four functions. Each SDS Agent may listen to any other agent in the same system, e.g., a cloud cluster, an SDS, or a hyper-converged system. In one example, each SDS Agent may listen to the other agents via SDS cluster 210. Each SDS Agent may forward data to any other agent in the same system, e.g., a cloud cluster, an SDS, or a hyper-converged system. Data may be forwarded via a unicast operation, a multicast operation, or a broadcast operation. As an example, as shown in FIG. 2, SDS Agent 232 may send data via a multicast operation (M1) to Host 1 244 and to Host 3 248. Further, as shown in FIG. 2, SDS Agent 234 may send data via unicast operation (U1) to Host 3 248. Each SDS Agent may also be configured to perform a computation operation based on the relevant data from the other agents. As an example, each SDS Agent may generate a code by performing an exclusive-OR operation on fragments of data. Thus, as shown in FIG. 2, SDS Agent 238 may generate a code $A_p$ based on fragment of data ($A_0$) stored at disk 252, fragment of data ($A_1$) stored at disk 254, and fragment of data ($A_2$) stored at disk 256. When the fragment of data ($A_1$) stored at disk 254 is modified by another fragment of data ($A_1'$), SDS Agent 238 may generate a new code $A_p'$ based on the previously stored code $A_p$, the fragment of data ($A_1$) and the fragment of data ($A_1'$). Each SDS Agent may also be further configured to perform read/write operations on the local disks corresponding to the host at which the SDS Agent resides. As an example, SDS Agent 232 may perform read/write operations on disk 252, which corresponds to Host 0 242, where SDS Agent 232 resides. Although FIG. 2 shows a certain number of components of FTDIHS 200 arranged in a certain manner, there could be more or fewer number of components arranged differently. As an example, although FIG. 2 shows one SDS Agent per host, one SDS Agent may be shared by multiple hosts.

Figure 3:
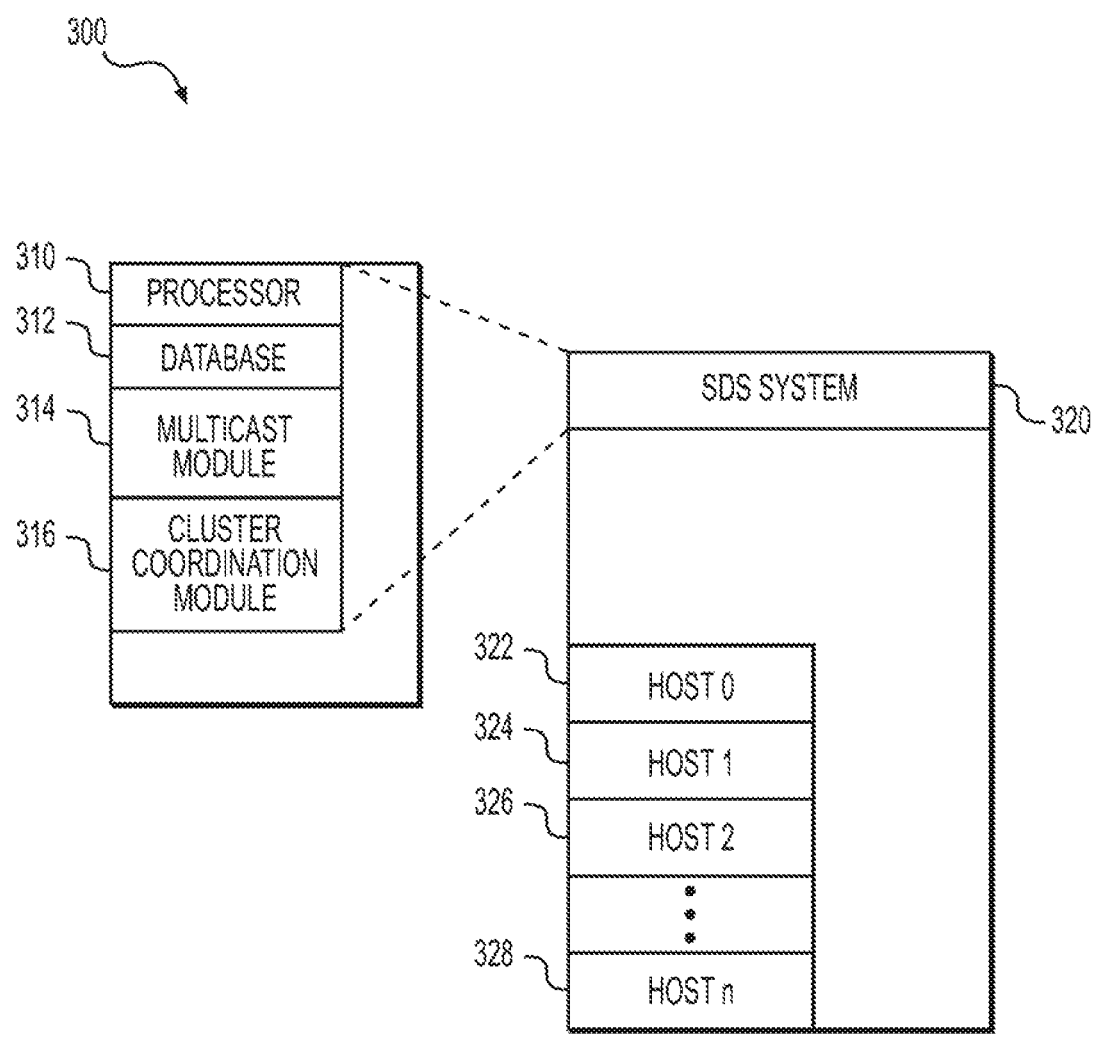
FIG. 3 is a block diagram of a portion of a fault-tolerant distributed information handling system in accordance with one example.

FIG. 3 is a block diagram of a portion 300 of a fault-tolerant distributed information handling system (e.g., FTDIHS 200) in accordance with one example. Portion 300 may include a SDS system 320 coupled to Host 0 322, Host 1 324, Host 2 326, and Host n 328. Any of these hosts may be the same as described with respect to FIG. 2. In addition, although not shown, each of these hosts may have corresponding storage disks for storing data fragments or codes, such as erasure codes to provide fault tolerance. A cluster of hosts, such as the ones shown in FIG. 3, may correspond to the hosts that are coupled to SDS system 320. Although not shown in FIG. 3, a cluster of hosts may include additional switches or other hardware to enable the cluster of hosts to communicate with each other using modules, such as SDS Agents or other functionality. As an example, at a physical network level, multiple switches could be coupled via a network, such as Ethernet, to an aggregation switch. In this example, SDS system 320 may include a processor 310, a database 312, a multicast module 314, and a cluster coordination module 316.

With continued reference to FIG. 3, processor 310 may be implemented using an off-the-shelf processor or using one or more Field-Programmable Gate Arrays (FPGAs), Application-Specific Integrated Circuits (ASICs), Application-Specific Standard Products (ASSPs), System-on-a-Chip systems (SOCs), or Complex Programmable Logic Devices (CPLDs). Processor 310 may be configured to perform some of the functions corresponding to FTDIHS 200. In one example, to allow SDS Agents to transmit data via multicast operations in a network, multicast addressing may be implemented in Layer 2 (e.g., the data link layer) and Layer 3 (e.g., the network layer). The network may be implemented using Ethernet, FDDI, or other types of networking technologies. In one example, multicast transmissions may be enabled using Internet Group Management Protocol (IGMP) snooping. Database 312 may include tables or other data structures that may be used to track the hosts that may be part of a multicast group. Multicast module 314 may correspond to the software functionality in Layer 2 and/or Layer 3 that might enable multicast transmission by recognizing an address as a multicast address. Multicast module 314, when executed by processor 310, may further manage additional tables or data structures stored in database 312 to enable a particular SDS Agent to transmit fragments of data to only those hosts that need to receive the transmission or the hosts that are part of a multicast group within the cluster of hosts that are part of FTDIHS 200. Multicast module 314 may also allow hosts to transmit data or codes, such as erasure codes, to the other hosts of the cluster using unicast transmission. Multicast operations may be implemented based on User Datagram Protocol (UDP) in a TCP/IP based system. Unicast operations may be implemented based on Transport Control Module (TCP) in a TCP/IP based system. Cluster coordination module 316, when executed by processor 310, may allow management of the group of hosts that are part of FTDIHS 200. In one example, cluster coordination module 316 may receive a request from any of the SDS Agents to determine: (1) a location of a disk corresponding to a fragment of data, (2) a location of a disk corresponding to a code, and (3) a location of each of any other fragments of data requiring modification as part of providing redundancy in the system. In one example, SDS Agents, such as SDS Agents 232, 234, 236, and 238 may: (1) retrieve the information concerning the location of a disk from cluster coordination module 316, (2) determine the multicast group identifier, and (3) perform a multicast using the multicast group identifier. In one example, SDS system 320 may support multicast operations using an IGMP Querier and IGMP Snooping functionality that may be part of the network switches, such as the Top of the Rack (ToR) switches. Cluster coordination module 316 may manage the tables or data structures stored in database 312. One such table may include a list of all of the addresses or other identities of the hosts that are part of a cluster. Cluster coordination module 316 may also store, in database 312, information concerning the location of each of the disk(s) corresponding to the hosts that may be part of a multicast group. Cluster coordination module 316 may send out requests, such as IGMP group membership queries, to determine the membership of any hosts in the cluster. This may allow updating of the membership in a dynamic manner. Although FIG. 3 shows a certain number of components of a portion 300 of FTDIHS 200 arranged in a certain manner, there could be more or fewer number of components arranged differently. As an example, although not shown in FIG. 3, SDS system 320 may communicate with other SDS systems, switches or routers that may include similar functionality to enable multicast transmission and unicast transmission across a larger cluster of hosts or additional clusters of hosts, as needed.

Figure 4:
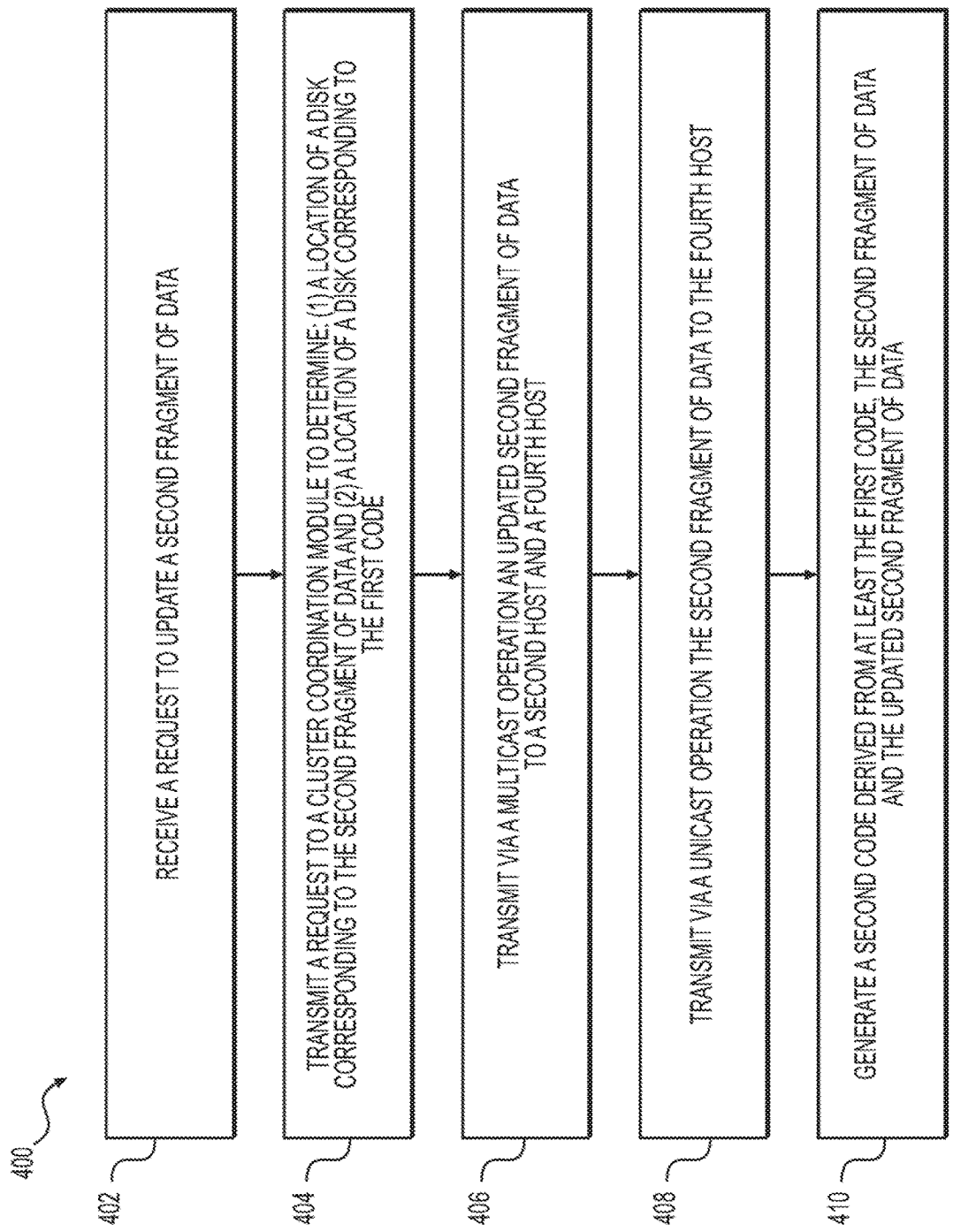
FIG. 4 is a diagram illustrating a method for providing fault tolerance in accordance with another example.

FIG. 4 is a diagram illustrating a method 400 for providing fault tolerance in a distributed information handling system, such as the one shown in FIG. 2, in accordance with an example. In step 402, an SDS Agent, such as SDS Agent 232 of FIG. 2, may receive a request to perform an operation on a fragment of data, such as to update a second fragment of data. With respect to the example shown in FIG. 2, the second fragment of data may be $A_1$ and it may be stored in disk 254 corresponding to Host 1 244. The updated second fragment of data may be $A_1'$. As discussed earlier such a request may be received by any of the SDS Agents that may be part of a multicast group, a cluster or a similar group. In step 404, an SDS Agent, such as SDS Agent 232 of FIG. 2, may transmit a request to a cluster coordination module, such as cluster coordination module 316 of FIG. 3, to determine: (1) a location of a disk corresponding to the second fragment of data and (2) a location of a disk corresponding to a first code. As an example, the first code may be an erasure code derived from a first fragment of data (e.g., $A_0$ stored at disk 252 of FIG. 2), the second fragment of data (e.g., $A_1$ stored at disk 254 of FIG. 2), and a third fragment of data (e.g., $A_3$ stored at disk 258 of FIG. 2). As an example, assuming the fragments of data have the values of: $A_1$=0110, $A_2$=1001, and $A_3$=1110, the first code may be calculated using the following: $A_1 \oplus A_2 \oplus A_3 = A_p$. Thus, $A_p$=1001. Moving the elements in the previous equation from one side to the other side yields $A_1 \oplus A_p = A_2 \oplus A_3$. For the values in this example, $0110 \oplus 0001 = 1001 \oplus 1110$ or 0111=0111. In step 406, an SDS Agent, such as SDS Agent 232 of FIG. 2, may transmit via a multicast operation the updated second fragment of data (e.g., $A_1'$) to a second host (e.g., Host 1 244 of FIG. 2) and to a fourth host (e.g., Host 3 248 of FIG. 2). The multicast operation may involve coordination with SDS system 320 of FIG. 3 including database 312, multicast module 314, and cluster coordination module 316. As an example, SDS Agent 232 may transmit the multicast operation request to SDS system 320. In one example, an SDS Agent, such as any one of SDS Agents 232, 234, 236, and 238 may: (1) retrieve the information concerning the location of a disk from cluster coordination module 316, (2) determine the multicast group identifier, and (3) perform a multicast operation using the multicast group identifier. In another example, cluster coordination module 316 may access database 312 to determine the addresses of the hosts that are part of the multicast group in a cluster. Multicast module 314 may then transmit the fragments of data to the respective hosts. As part of this operation, multicast module 314 may send source packets of fragments of data to multiple receivers as a group transmission. Packets may be replicated at points of divergence, such as routers or switches.

Still referring to FIG. 4, in step 408, an SDS Agent, such as SDS Agent 234 of FIG. 2, may transmit via a unicast operation the second fragment of data (e.g., $A_1$ stored at disk 254 of FIG. 2) to the fourth host (e.g., Host 3 248 of FIG. 2). Alternatively, as long as SDS Agent 234 has the address of the fourth host (e.g., Host 3 248 of FIG. 2), then it may simply transmit the second fragment of data to the fourth host. In step 410, an SDS Agent (e.g., SDS Agent 248) or another module may generate a second code (e.g., $A_p'$, as shown in FIG. 2) derived from at least the first code ($A_p$, as shown in FIG. 2), the second fragment of data (e.g., $A_1$ stored at disk 254 of FIG. 2) and the updated second fragment of data (e.g., $A_1'$). In one example, the second code may be generated by performing an exclusive-OR operation on the first code, the second fragment of data, and the updated second fragment of data. The exclusive-OR operation may be performed on a bitwise fashion. Thus, using the previous values of the fragments of data and the derived value of the first code $(A_p)$=0001, the equation $A_1 \oplus A_2 \oplus A_3 = A_p$ may be used to calculate the second code. However, $A_2 \oplus A_3$ may be replaced by $A_1 \oplus A_p$, so $A_1' \oplus A_1 \oplus A_p = A_p$ will produce the same result. As an example, if the value of the updated second fragment of data $(A_1')$ is 1101, then $A_1' \oplus A_2 \oplus A_3 = A_p$ is equal to $1101 \oplus 1001 \oplus 1110 = 1010$ and $A_1' \oplus A_1 \oplus A_p = A_p$ is also equal to $0110 \oplus 0001 \oplus 1101 = 1010$. Each fragment of data may be 4 KB, 32 KB, or 64 KB. Portions of fragments of data may be subjected to the exclusive-OR operation together in units of 128 or 256 bits using vector instructions or other types of such instructions. Although FIG. 4 recites certain number of steps performed in a certain order, method 400 may not include all of these steps and the order may be different. Also, the location of the code (e.g., an erasure code) and the other fragments of data is for illustration of an example method only. The code and the fragments of data may be stored differently. In addition, although FIG. 4 describes method 400 with respect to FIG. 2, such a method could be implemented with a larger number of hosts interconnected differently. As an example, consider that there are n data fragments and 1 code and assuming $A_x$ is the xth data fragment (indexing from 0 to n−1), $A_p$ is the parity fragment and the mth data fragment needs to be modified as $A_m'$, the new code $A_p'$ may be calculated as follows: $A_0 \oplus A_1 \oplus \ldots \oplus A_{m-1} \oplus A_{m+1} \oplus \ldots \oplus A_{n-1} = A_m \oplus A_p$ and $A_p' = A_0 \oplus A_1 \oplus \ldots A_{m-1} \oplus A_m' \oplus A_{m+1} \ldots A_{n-1} = A_m \oplus A_p \oplus A_m'$. By using method 400, network bandwidth utilization may be improved without introducing additional compute overhead and without requiring any additional external resources. Thus, as an example, fault-tolerance using erasure codes may be improved by changing the way information is populated and by changing the location(s) of the code calculation, such as a parity calculation. The improved network bandwidth may advantageously be conserved for other uses including, for example, supporting a higher number of concurrent read/write operations for users of FTDIHS 200. In addition, for the example discussed with respect to FIG. 4, for a single write request, the latency of the operation may be lowered because four in-flight operations may be reduced to two in-flight operations.

Figure 5:
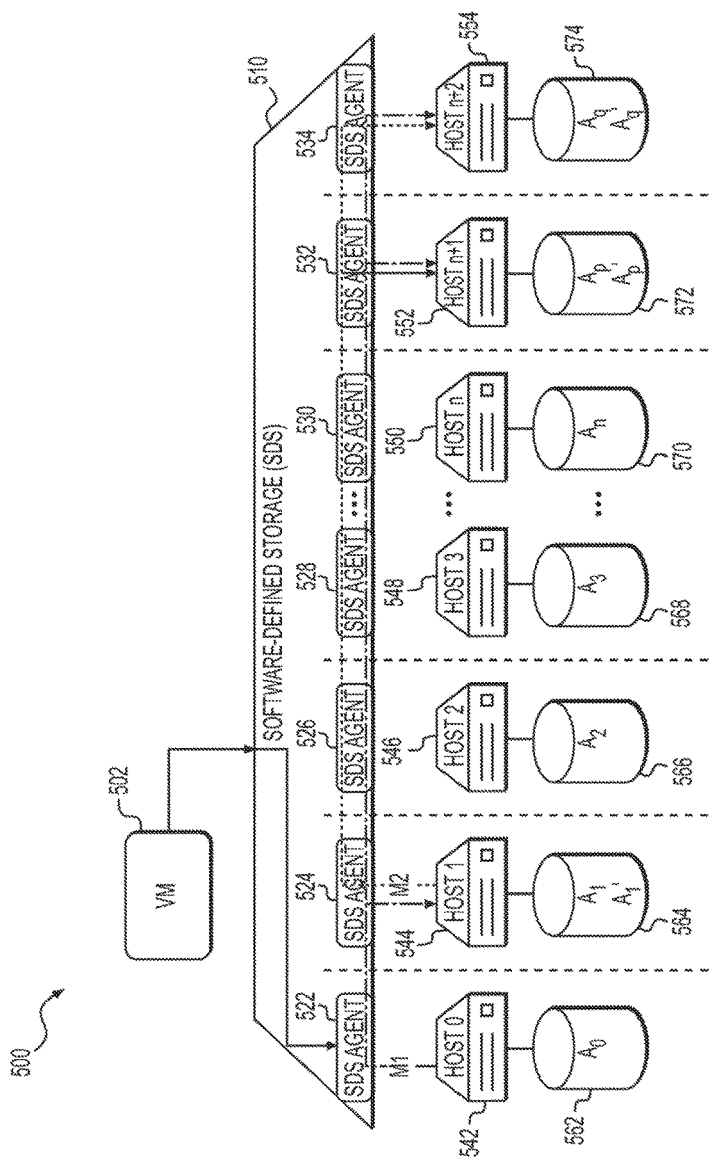
FIG. 5 is a block diagram of a fault-tolerant distributed information handling system with distributed hosts in accordance with one example.

FIG. 5 is a block diagram of a fault-tolerant distributed information handling system (FTDIHS) 500 with distributed hosts in accordance with one example. Virtual machine 502 may access FTDIHS 500 via software defined storage (SDS) cluster 510. In one example, virtual machine 502 may perform read/write operations on any of the storage resources associated with SDS cluster 510 via SDS Agents 522, 524, 526, 528, 530, 532, and 534. Requests for read/write operations concerning any of the storage resources may also be issued by a software container, an application, or any other process besides a virtual machine. FTDIHS 500 may further include Host 0 542, Host 1 544, Host 2 546, and Host 3 548, Host n 550, Host n+1 552, and Host n+2 554. Host 0 542 may be coupled to a storage disk 562. Host 1 544 may be coupled to a storage disk 564. Host 2 546 may be coupled to a storage disk 566. Host 3 548 may be coupled to a storage disk 568. Host n 550 may be coupled to storage disk 570. Host n+1 552 may be coupled to storage disk 572. Host n+2 may be coupled to storage disk 574. SDS Agents 522, 524, 526, 528, 530, 532, and 534 may be configured to run on a corresponding host. The SDS Agents may be configured to communicate across multiple hosts (e.g., Host 0, 1, 2, 3, n, n+1, and n+2) via SDS cluster 510.

Still referring to FIG. 5, each SDS Agent may provide at least four functions. Each SDS Agent may listen to any other agent in the same system, e.g., a cloud cluster, an SDS, or a hyper-converged system. In one example, each SDS Agent may listen to the other agents via SDS cluster 510. Each SDS Agent may forward data to any other agent in the same system, e.g., a cloud cluster, an SDS, or a hyper-converged system. Data may be forwarded via a unicast operation, a multicast operation, or a broadcast operation. As an example, as shown in FIG. 5, SDS Agent 522 may send data via a multicast operation (M1) to Host 1 544, Host n+1 552, and to Host n+2 554. Further, as shown in FIG. 5, SDS Agent 524 may send data via a multicast operation (M2) to Host n+1 552 and to Host n+2 554. Each SDS Agent may also be configured to perform a computation operation based on the relevant data from the other agents. As an example, each SDS Agent may generate a code by performing an exclusive-OR operation on fragments of data. Thus, as shown in FIG. 5, SDS Agent 532 may generate a code $A_p$ based on fragment of data ($A_0$) stored at disk 562, fragment of data ($A_1$) stored at disk 564, fragment of data ($A_2$) stored at disk 566, fragment of data ($A_3$) stored at disk 568, and fragment of data ($A_n$) stored at disk 570. In addition, to provide additional fault tolerance, as shown in FIG. 5, another SDS Agent 534 may generate a code $A_q$ based on a generator (g) of the Galois Field, fragment of data ($A_0$) stored at disk 562, fragment of data ($A_1$) stored at disk 564, fragment of data ($A_2$) stored at disk 566, fragment of data ($A_3$) stored at disk 568, and fragment of data ($A_n$) stored at disk 570. When the fragment of data ($A_1$) stored at disk 564 is modified by another fragment of data ($A_1'$), SDS Agent 532 may generate a new code $A_p'$ based on the previously stored code $A_p$, the fragment of data ($A_1$) and the fragment of data ($A_1'$). In addition, SDS Agent 534 may generate a new code $A_q'$ based on the previously stored code $A_q$, the fragment of data ($A_1$) and the fragment of data ($A_1'$). Each SDS Agent may also be further configured to perform read/write operations on the local disks corresponding to the host at which the SDS Agent resides. As an example, SDS Agent 522 may perform read/write operations on disk 562, which corresponds to Host 0 542, where SDS Agent 522 resides. Although FIG. 5 shows a certain number of components of FTDIHS 500 arranged in a certain manner, there could be more or fewer number of components arranged differently. As an example, although FIG. 5 shows one SDS Agent per host, one SDS Agent may be shared by multiple hosts. In addition, FIG. 3 is a block diagram of a portion of a fault-tolerant distributed information handling system (e.g., FTDIHS 200 and FTDIHS 500) in accordance with one example. Unless stated otherwise, the functionality of the components of portion 300 is similar in the context of FTDIHS 500 to their functionality in the context of FTDIHS 300.

Figure 6:
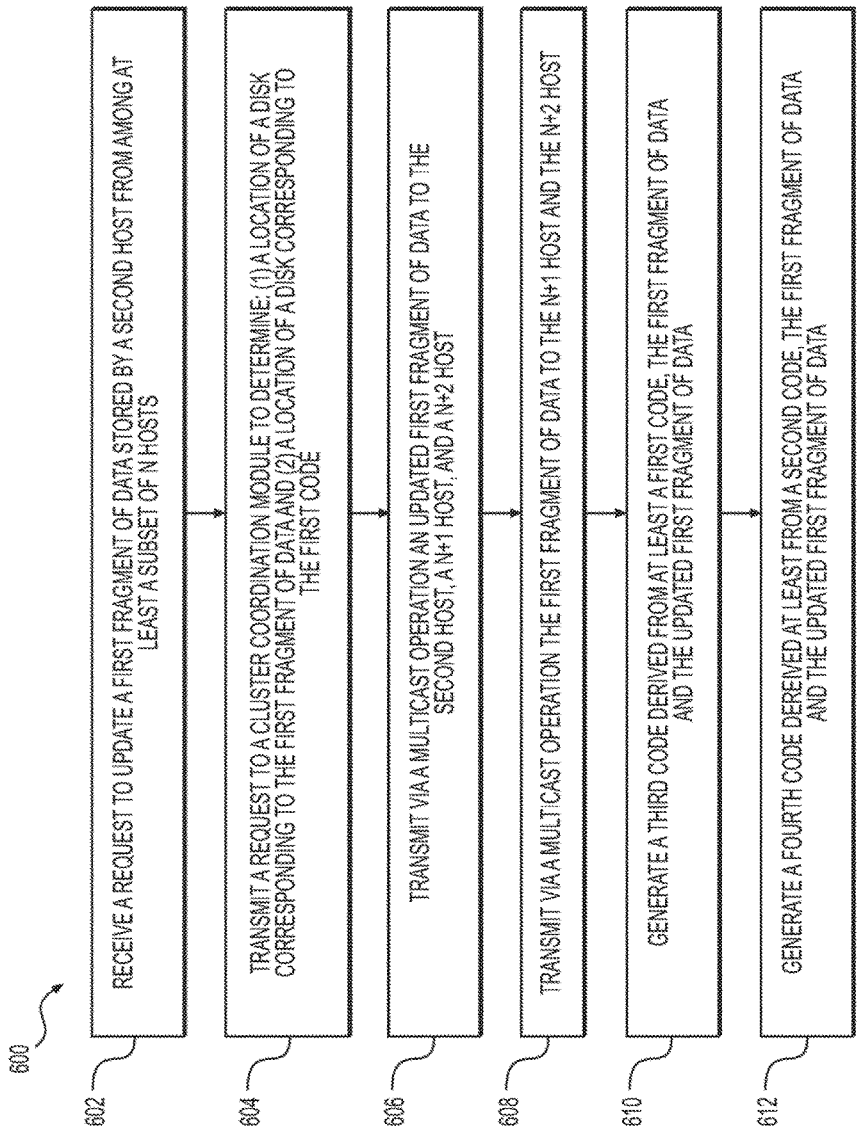
FIG. 6 is a diagram illustrating a method for providing fault tolerance in accordance with another example.

FIG. 6 is a diagram illustrating a method 600 for providing fault tolerance in a distributed information handling system, such as the one shown in FIG. 5, in accordance with an example. As shown in FIG. 5, FTDIHS 500 includes n+2 hosts and in this example n hosts have fragments of data and two hosts (n+1 and n+2) have codes, such as erasure codes stored in their corresponding disks. The number n is arbitrary and any host could have data or code, as configured. In step 602, an SDS Agent, such as SDS Agent 522 of FIG. 5, may receive a request to perform an operation on a fragment of data, such as to update a first fragment of data stored by a second host (e.g., Host 1 544 of FIG. 5) from among at least a subset of n hosts. With respect to the example shown in FIG. 5, the first fragment of data may be $A_1$ and it may be stored in disk 564 corresponding to Host 1 544. The updated first fragment of data may be $A_1'$. As discussed earlier such a request may be received by any of the SDS Agents that may be part of a multicast group, a cluster or a similar group. In step 604, an SDS Agent, such as SDS Agent 522 of FIG. 5, may transmit a request to a cluster coordination module, such as cluster coordination module 316 of FIG. 3, to determine: (1) a location of a disk corresponding to the first fragment of data, (2) a location of a disk corresponding to a first code, and (3) a location of a disk corresponding to a second code. As an example, the first code (e.g. $A_p$) may be an erasure code derived from a fragment of data ($A_0$) stored at disk 562, fragment of data ($A_1$) stored at disk 564, fragment of data ($A_2$) stored at disk 566, fragment of data ($A_3$) stored at disk 568, and fragment of data ($A_n$) stored at disk 570. As an example, the second code (e.g., $A_q$) may be based on a generator (g) of the Galois Field, fragment of data ($A_0$) stored at disk 562, fragment of data ($A_1$) stored at disk 564, fragment of data ($A_2$) stored at disk 566, fragment of data ($A_3$) stored at disk 568, and fragment of data ($A_n$) stored at disk 570. In step 606, an SDS Agent, such as SDS Agent 522 of FIG. 5, may transmit via a multicast operation (e.g., M1 as shown in FIG. 5) the updated fragment of data (e.g., $A_1'$) to a second host (e.g., Host 1 544 of FIG. 5), to a n+1 host (e.g., Host n+1 552 of FIG. 5), and to a n+2 host (e.g., Host n+2 554 of FIG. 5). In one example, an SDS Agent, such as any one of SDS Agents 522, 524, 526, 528, 530, 532, and 534 may: (1) retrieve the information concerning the location of a disk from cluster coordination module 316, (2) determine the multicast group identifier, and (3) perform a multicast operation using the multicast group identifier. In another example, SDS Agent 532 may transmit the multicast operation request to SDS system 320. In turn, cluster coordination module 316 may access database 312 to determine the addresses of the hosts that are part of a multicast group in the cluster. Multicast module 314 may then transmit the fragments of data to the respective hosts. As part of this operation, multicast module 314 may send source packets of fragments of data to multiple receivers as a group transmission. Packets may be replicated at points of divergence, such as routers or switches.

Still referring to FIG. 6, in step 608, an SDS Agent, such as SDS Agent 524 of FIG. 5, may transmit via a multicast operation (e.g., M2 as shown in FIG. 5) the first fragment of data (e.g., $A_1$ stored at disk 564 of FIG. 5) to the n+1 host (e.g., Host n+1 552 of FIG. 5), and to the n+2 host (e.g., Host n+2 554 of FIG. 5). In step 610, an SDS Agent (e.g., SDS Agent 532) or another module may generate a second code (e.g., $A_p'$, as shown in FIG. 5) derived from the first code (e.g., $A_p$), the fragment of data ($A_1$) and the fragment of data ($A_1'$). In one example, the second code may be generated by performing an exclusive-OR operation on the first code, the fragment of data ($A_1$) and the fragment of data ($A_1'$). In step 612, an SDS Agent (e.g., SDS Agent 534) or another module may generate a fourth code (e.g., $A_q'$, as shown in FIG. 5) derived from the second code (e.g., $A_q$), the fragment of data ($A_1$) and the fragment of data ($A_1'$). In one example, the second code may be generated by performing an exclusive-OR operation on the second code, the fragment of data ($A_1$)

and the fragment of data ($A_1'$). The exclusive-OR operation may be performed in a bitwise fashion. Each fragment of data may be 4 KB, 32 KB, or 64 KB. Portions of fragments of data may be subjected to the exclusive-OR operation together in units of 128 or 256 bits using vector instructions or other types of such instructions. Although FIG. 6 recites certain number of steps performed in a certain order, method 600 may not include all of these steps and the order may be different. Also, the location of the codes (e.g., erasure codes) and the other fragments of data is for illustration of an example method only. The codes and the fragments of data may be stored differently. In addition, although FIG. 6 describes method 600 with respect to FIG. 5, such a method could be implemented with a larger number of hosts interconnected differently. As an example, consider that there are n data fragments and two codes and assuming $A_x$ is the xth data fragment (indexing from 0 to n−1), $A_x$ is the parity fragment and the mth data fragment needs to be modified as $A_m'$, the new code $A_p'$ may be calculated as follows: $g^0 A_0 \oplus g^1 A_1 \oplus \ldots \oplus g^{m-1} A_{m-1} \oplus g^{m+1} A_{m+1} \oplus \ldots \oplus g^{n-1} A_{n-1} = g^m A_m \oplus A_q$ and $A'_q = g^0 A_0 \oplus g^1 A_1 \oplus \ldots g^{m-1} A_{m-1} \oplus g^m A'_m \oplus g^{m+1} A_{m+1} \ldots g^{n-1} A_{n-1} = g^m A_m \oplus A_q \oplus g^m A'_m$, where g is a generator of the Galois Field.

With continued reference to FIG. 6, although FIG. 6 describes method 600 using multicast operations, in an alternative embodiment only unicast operations may be used. As an example, in an SDS that does not provide TCP functionality and provides only UDP functionality, only unicast operations may be used. As an example, step 606 may include transmitting the second fragment of data to the hosts via three unicast operations. Similarly, step 608 may include transmitting the first fragment of data via two unicast operations. Even in such a scenario the network bandwidth may be advantageously saved by allowing code (e.g., erasure code) calculations locally. Alternatively, in another embodiment only multicast operations may be used by the SDS Agents to transmit fragments of data and any previously calculated code(s). This may advantageously provide better utilization of the network bandwidth in a system such as FTDIHS 500.

It is to be understood that the methods, modules, and information handling systems depicted herein are merely exemplary. In general, although the fault tolerant systems and methods have been described using erasure codes as examples, other coding schemes may be used. As an example, any code that provides a degree of fault tolerance may be used. Examples of such codes include, but are not limited to, Reed Solomon codes and other types of codes that provide fault tolerance by expanding and coding the data bits. Alternatively, or in addition, the functionality described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with the examples described in this disclosure can also include instructions stored in a non-transitory media. The term "non-transitory media" as used herein refers to any media storing data and/or instructions that cause a machine, such as processor 310, to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory, such as DRAM, SRAM, a cache, or other such media. Non-transitory media is distinct from, but can be used in conjunction with, transmission media. Transmission media is used for transferring data and/or instruction to or from a machine, such as processor 310 or the various virtual machines that may be part of an information handling system. Exemplary transmission media include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements. In addition, as used herein, the term "in response" is not limited to a direct and an immediate action based on another action. Instead, this term includes actions that may occur as part of a sequence of operations in which only a subset of the actions, such as a first action, may occur based on another action and the later actions may occur because they may be required to complete a method or that may be part of a sequence of actions that flow from the first action.

What is claimed:

1. A method in an information handling system (IHS) comprising: (1) N hosts, wherein N is a positive integer, and wherein each of the N hosts is configured to store at least one fragment of data, (2) an N+1 host configured to store at least a first code derived from at least one fragment of data stored by each of a subset of the N hosts, (3) an N+2 host configured to store at least a second code derived from at least one fragment of data stored by each of the subset of the N hosts, the method comprising:
   in response to receiving a request by a first agent corresponding to any of the N hosts regarding a first fragment of data stored by a second host from among the at least the subset of the N hosts:
      the first agent transmitting via a multicast operation an updated first fragment of data to the second host, the N+1 host, and the N+2 host;
      a second agent corresponding to the second host transmitting via a multicast operation the first fragment of data to the N+1 host and N+2 host;
      an N+1 agent corresponding to the N+1 host generating a third code derived from at least the first code, the first fragment of data, and the updated first fragment of data; and
      an N+2 agent corresponding to the N+2 host generating a fourth code derived from at least the second code, the first fragment of data, and the updated first fragment of data.

2. The method of claim 1 further comprising the second agent overwriting the first fragment of data with the updated first fragment of data.

3. The method of claim 1 further comprising: (1) the N+1 agent writing the third code to a storage disk associated with the N+1 host and (2) the N+2 agent writing the fourth code to a storage disk associated with the N+2 host.

4. The method of claim 1, wherein the at least the first code is generated by performing an exclusive-OR operation using each one of the at least one fragment of data stored by each of the subset of the N hosts.

5. The method of claim 1, wherein the third code is generated by performing an exclusive-OR operation using the at least the first code and each one of the at least one fragment of data stored by each of the subset of the N hosts.

6. The method of claim 1 further comprising in response to receiving the request by the first agent regarding the first fragment of data, the first agent transmitting a request to a cluster coordination module to determine: (1) a location of a disk corresponding to the first fragment of data, (2) a location of a disk corresponding to the at least the first code, and (3) a location of each of any other fragments of data requiring modification.

7. The method of claim 1, wherein each of the at least the first code and the at least the second code is an erasure code, wherein the erasure code adds redundancy to the IHS to tolerate at least one failure in storage disks associated with the at least the subset of the N hosts.

8. A$_n$ information handling system (IHS) comprising:
   N hosts, wherein N is a positive integer, and wherein each of the N hosts is configured to store at least one fragment of data;
   an N+1 host configured to store at least a first code derived from at least one fragment of data stored by each of a subset of the N hosts;
   a first agent corresponding to any of the N hosts configured to, in response to a request regarding a first fragment of data stored by a second host from among the at least a subset of the N hosts, transmit via a multicast operation an updated first fragment of data to the N+1 host;
   a second agent corresponding to the second host configured to transmit via a unicast operation the updated first fragment of data to the N+1 host; and
   an N+1 agent corresponding to the N+1 host configured to generate a second code derived from the at least the first code, the updated first fragment of data, and at least one fragment of data stored by each of the subset of the N hosts.

9. The IHS of claim 8, wherein the second agent is further configured to overwrite the first fragment of data with the updated first fragment of data.

10. The IHS of claim 8, wherein the N+1 agent is further configured to write the third code to a storage disk associated with the N+1 host.

11. The IHS of claim 8, wherein the N+1 agent is configured to generate the at least the first code by performing an exclusive-OR operation using each one of the at least one fragment of data stored by each of the subset of the N hosts.

12. The IHS of claim 8, wherein the N+1 agent is configured to generate the second code by performing an exclusive-OR operation using the at least the first code and each one of the at least one fragment of data stored by each of the subset of the N hosts.

13. The IHS of claim 8 further comprising a cluster coordination module configured to receive a request from the first agent to determine: (1) a location of a disk corresponding to the updated first fragment of data, (2) a location of a disk corresponding to the at least the first code, and (3) a location of each of any other fragments of data requiring modification.

\* \* \* \* \*